United States Patent [19]

Keum

[11] Patent Number: 5,245,470

[45] Date of Patent: Sep. 14, 1993

[54] POLARIZING EXPOSURE APPARATUS USING A POLARIZER AND METHOD FOR FABRICATION OF A POLARIZING MASK BY USING A POLARIZING EXPOSURE APPARATUS

[75] Inventor: Eun S. Keum, Suwon, Rep. of Korea

[73] Assignee: Gold Star Electron Co., Ltd., Chung-Cheon, Rep. of Korea

[21] Appl. No.: 844,133

[22] Filed: Mar. 2, 1992

[30] Foreign Application Priority Data

Jun. 13, 1991 [KR] Rep. of Korea ................. 9736/1991

[51] Int. Cl.$^5$ .................. G02B 27/28; G02B 5/30; B29D 11/00
[52] U.S. Cl. .................... 359/485; 264/1.3; 359/489
[58] Field of Search ............... 359/489, 485; 264/1.3; 250/548, 225

[56] References Cited

U.S. PATENT DOCUMENTS

| | | | |
|---|---|---|---|
| 2,316,643 | 4/1943 | Yule | 359/489 |
| 2,440,102 | 4/1948 | Land | 359/489 |
| 4,937,459 | 6/1990 | Ina | 250/548 |
| 5,070,250 | 12/1991 | Komatsu et al. | 250/548 |
| 5,072,126 | 12/1991 | Progler | 250/548 |

Primary Examiner—Martin Lerner
Attorney, Agent, or Firm—Poms, Smith, Lande & Rose

[57] ABSTRACT

The present invention relates to a polarizing exposure apparatus using a polarizer for radiating polarized light on a polarizing mask and a method for a polarizing mask, for improved resolution, by using such a polarizing exposure apparatus. The polarizing exposure apparatus using a polarizer comprises a light source for radiating light, a pair of polarizing plates for respectively polarizing light radiated from the light source, a focusing lens for focusing the light polarized through said polarizing plates, a polarizing mask for passing only light of the desired pattern from the polarized light focused through the focusing lens and a reduction projection lens for forming the pattern on a wafer by reducing the light passed through the polarizing mask. The method for fabrication of a polarizing mask comprises a step of depositing a Chromium layer on a quartz substrate, patterning the Cr layer to form a Cr mask, forming a first polarizing film, etching said first polarizing film by using a photosensitive film, forming a second polarizing film to cover said first polarizing film and etching said second polarizing film to be alternatively formed with said first polarizing film. The present invention can improve resolution by using a simple polarizing exposure apparatus and it can fabricate a mask by conventional CAD techniques.

3 Claims, 5 Drawing Sheets

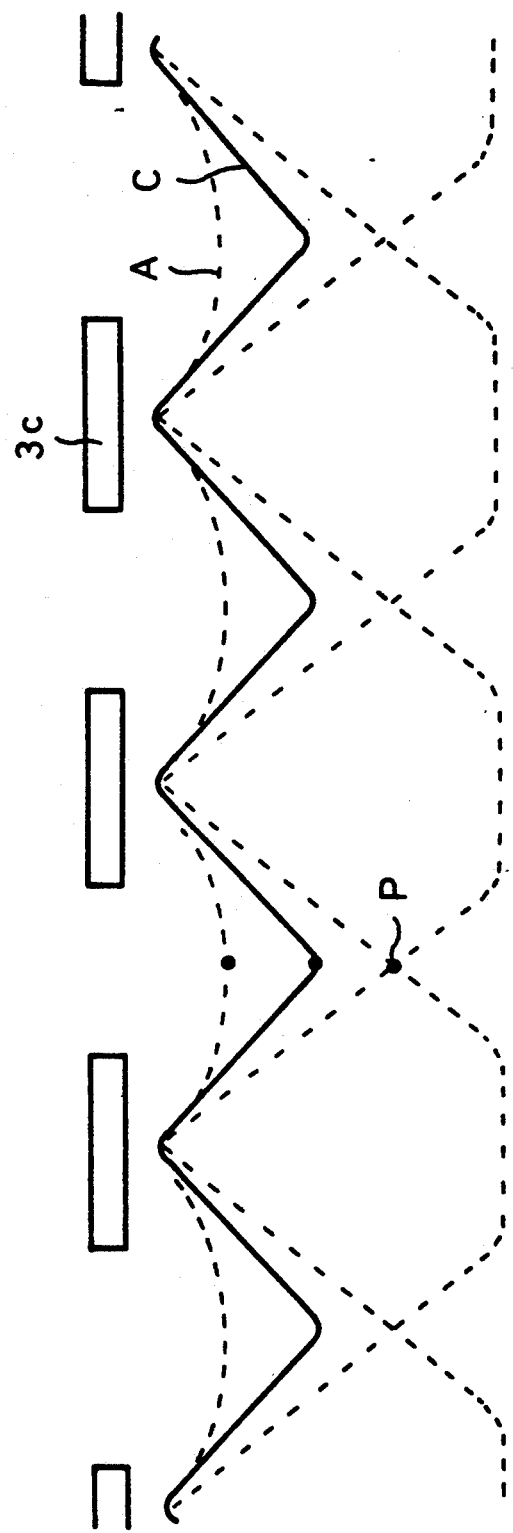

POLARIZING EXPOSURE APPARATUS USING A POLARIZER AND METHOD FOR FABRICATION OF A POLARIZING MASK BY USING A POLARIZING EXPOSURE APPARATUS

BACKGROUND OF THE INVENTION

The present invention relates to a polarizing exposure apparatus for radiating polarized light on a polarizing mask by using a polarizer and to a method for fabricating a polarizing mask with improved resolution by using such a polarizing exposure apparatus.

FIG. 1 shows an exposure apparatus using a Chromium (Cr) mask according to the prior art and FIG. 2 shows a process for forming the pattern by using the prior art exposure apparatus of FIG. 1.

As shown in FIG. 1, the prior exposure apparatus comprises a light source 1 for radiating light, a focusing lens 2 for focusing light radiated from light source 1, a Cr mask 3c for passing the light focused by focusing lens 2, and reduction projection lens 4 for transcribing on wafer 5 by reducing the light passed through Cr mask 3c.

The method for forming the pattern by using the prior art exposure apparatus shown in FIG. 1 will now be described with reference to FIG. 2.

Light of single wavelength is radiated from light source 1 and is selectively passed and focused through focusing lens 2. Cr mask 3c passes the focused light and the passed light is transcribed on to wafer 5 through reduction projection lens 4.

At this time, the form of the Cr mask 3c is transferred to the wafer 5 by the transcribed light, so that a pattern is formed in accordance with the form of the Cr mask 3c as shown in FIG. 2.

However, the prior art exposure apparatus is unable to precisely resolve the pattern, which is dense, by using a Cr mask because of light interference problems.

Furthermore, though resolution of the pattern can be improved by using a phase-inversion mask instead of a Cr mask, the fabrication process is complicated.

SUMMARY OF THE INVENTION

It is an object to provide an improved exposure apparatus using a polarizer and to provide a method for fabrication of a polarizing mask by using such a polarizing exposure apparatus.

To achieve the above object, the present invention provides a polarizing exposure apparatus using a polarizer and comprises a light source for radiating light, a pair of polarizing plates for respectively polarizing the light radiated from said light source, a focusing lens for focusing the light polarized through said polarizing plates, a polarizing mask for passing only light of the desired pattern from the polarized light focused through the focusing lens and a reduction projection lens for forming the desired pattern on the wafer by reducing the light passed through the polarizing mask.

Furthermore, the present invention provides a method for fabrication of a polarizing mask comprising a step for depositing a Cr layer on a quartz substrate, patterning the Cr layer to form a Cr mask, forming a first polarizing film, etching said first polarizing film by using the photoetching method, forming a second polarizing film to cover said first polarizing film, etching said second polarizing film to be alternatively formed with said first polarizing film.

BRIEF DESCRIPTION OF THE DRAWINGS

These and other objects of the invention will be better understood upon study of the Detailed Description of the Preferred Embodiments, below, together with the drawings in which;

FIG. 5 is a graph illustrating the density of the light between the polarizing mask of the present invention and the Cr mask of the prior art.

DETAILED DESCRIPTION OF THE PREFERRED EMBODIMENTS

Hereinbelow, the preferred embodiment of the present invention will be described in more detail with reference to FIG. 3 through FIG. 5.

Figure 1:
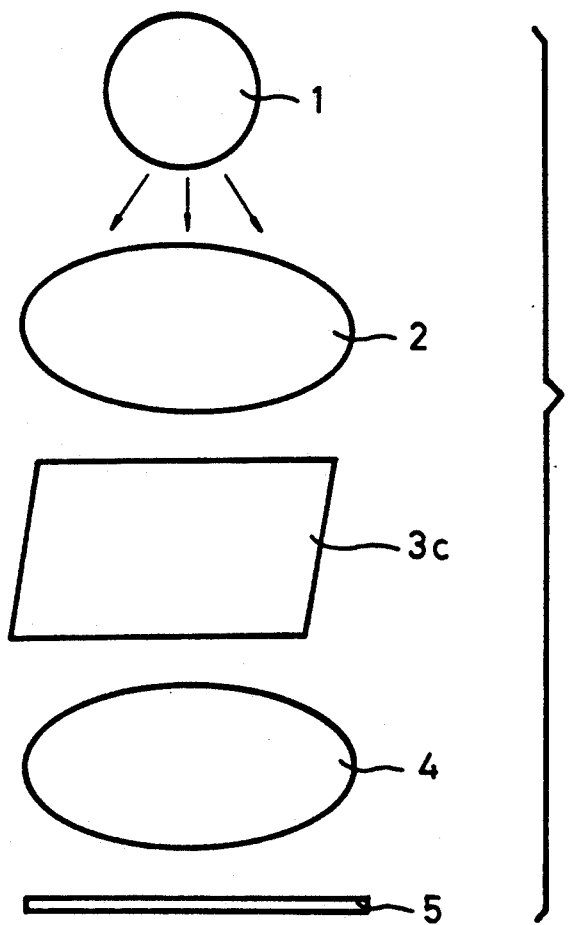
FIG. 1 is a schematic diagram of an exposure apparatus using a Cr mask according to the prior art.
Figure 2A:
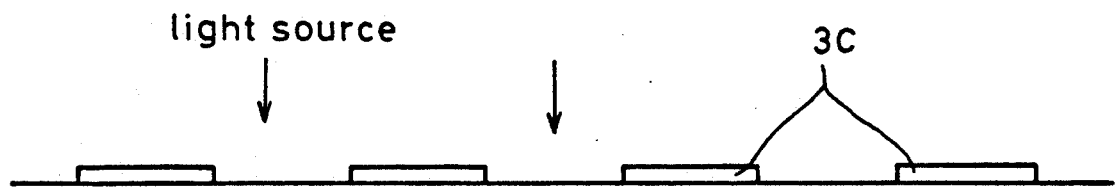
FIG. 2 is a diagram illustrating a process for forming the pattern by using the prior art Cr mask shown in FIG. 1.
Figure 2B:
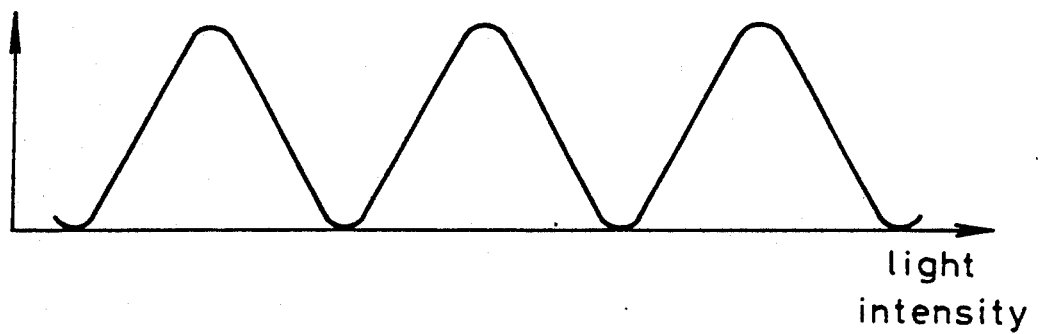
Figure 2C:
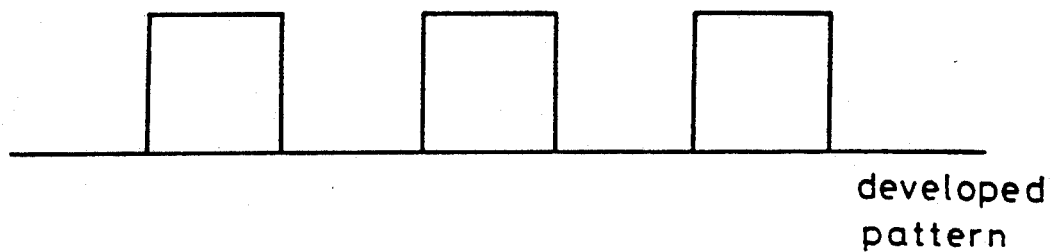
Figure 3:
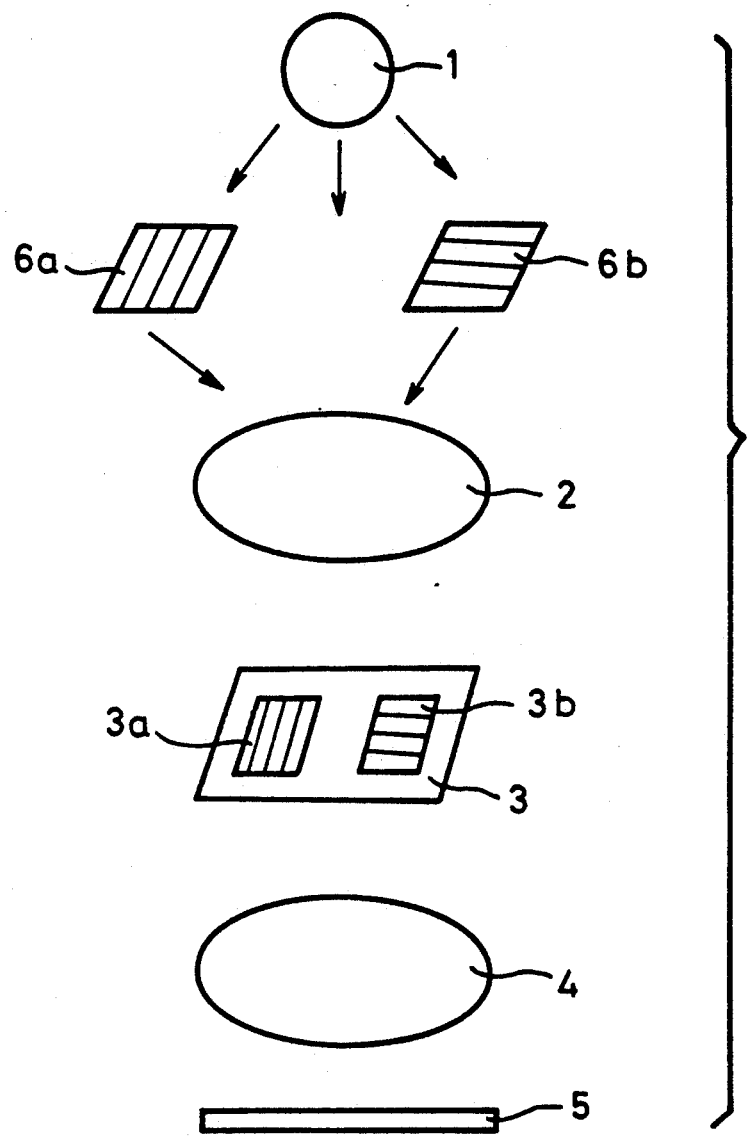
FIG. 3 is a schematic diagram of a polarizing exposure apparatus using a polarizer according to the present invention.

FIG. 3 shows a schematic diagram of the polarizing exposure apparatus using a polarizer according to the present invention.

As shown in FIG. 3, the polarizing exposure apparatus using a polarizer of the present invention comprises a light source 1 for radiating light, a pair of polarizing plates 6a and 6b for respectively polarizing the light radiated from said light source 1, a focusing lens 2 for focusing the light polarized through polarizing plates 6a and 6b, a polarizing mask 3, having patterns 3a and 3b, for passing only light of the desired pattern among from the polarized light focused through focusing lens 2 and a reduction projection lens 4 for forming the desired pattern on wafer 5 by reducing the light passed through polarizing mask 3.

Thus, in the polarizing exposure apparatus using a polarizer of the present invention, a pair of polarizing plates 6a and 6b for differently polarizing light from light source 1, are established between light source 1 and focusing lens 2, and polarizing mask 3 for passing only light of the desired pattern from the light focused through focusing lens 2 is established between focusing lens 2 and reduction projection lens 4.

The light radiated from light source 1 is polarized through either one of polarizing plates 6a and 6b. If the light passes through polarizing plate 6a, the light is polarized through polarizing plate 6a. This polarized light is focused through focusing lens 2 and radiated on to polarizing mask 3.

At this time, if the light is radiated on to polarizing mask 3, the light is not passed through pattern 3b but passed through pattern 3a, so that pattern 3a is formed on wafer 5 through reduction projection lens 4.

In contrast, light polarized through the polarizing plate 6b is passed only through pattern 3b of polarizing mask 3, so that pattern 3b is formed on wafer 5.

FIG. 4 shows a process for fabricating a polarizing mask by using the polarizing exposure apparatus of FIG. 3.

The method for fabricating a polarizing mask of the present invention will be described with reference to FIG. 4.

Figure 4A:
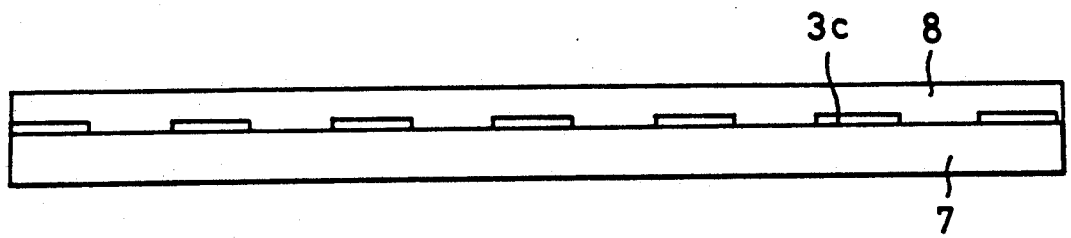
FIGS. 4A-4D are a cross-sectional view illustrating a process for fabricating a polarizing mask by using the polarizing exposure apparatus using a polarizer according to the present invention.

First, as shown in FIG. 4(A), a Cr layer is deposited on quartz substrate 7 and is patterned to form Cr mask 3c. A first polarizing film 8 is formed on the whole surface.

Figure 4B:
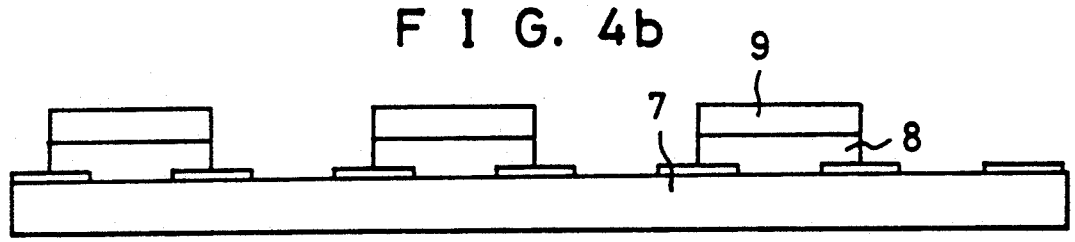

As shown in FIG. 4(B), a photosensitive film 9 is coated on the whole surface and is etched by using photoetching method. Then, first polarizing film 8 is etched so as to remain over Cr mask 3c in a pattern corresponding to patterned photosensitive film 9.

Figure 4C:
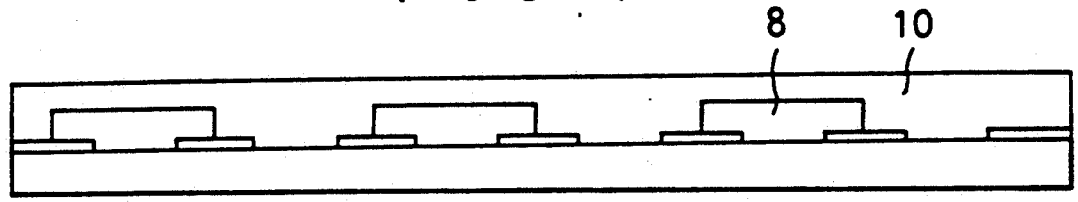

As shown in FIG. 4(C), said photosensitive film 9 is then removed and second polarizing film 10 is formed on the whole surface.

Figure 4D:
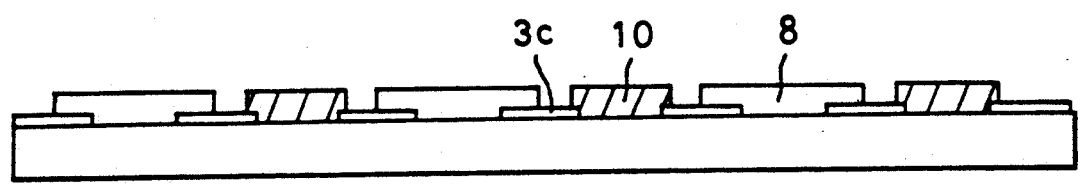

As shown in FIG. 4(D), second polarizing plate 10 is etched by a photoetching method so as to remain over Cr mask 3c in a pattern corresponding to the spaces between the pattern formed by said first polarizing plates 8.

FIG. 5 shows a graph illustrating the density of the light between the polarizing mask of the present invention and the Cr mask of the prior art.

In the prior art Cr mask case, the difference of the density of the light is smaller, as indicated at A of FIG. 5. Therefore, it is very difficult to form the desired pattern by using a Cr mask. In the present invention's polarizing mask case, because the difference of the density of the light becomes larger than that of the Cr mask case, as indicated at C of FIG. 5, the resolution can be improved.

Furthermore, if the amplitude of the point P is $E \sin \theta p$, the density of the light in the Cr mask becomes $(E \sin \theta p + E \sin \theta p)^2 = 4E^2 \sin^2 \theta p$. On the other hand, the density of the light in the polarizing mask becomes $E^2 \sin^2 \theta p + E^2 \sin^2 \theta p = 2E^2 \sin^2 \theta p$, thereby reducing to a half.

As above-mentioned, there is a problem in that the pattern is not precisely resolved in using the conventional Cr mask and the fabrication process is complicated in using a phase-inversion mask. The present invention can improve resolution by using the simple polarizing exposure apparatus described above and it can fabricate the mask by the conventional CAD.

While the invention has been particularly shown and described herein with reference to the preferred embodiments thereof, it will be understood by those skilled in the art that various modifications and changes may be made utilizing the principles of the invention as described herein without departing from the spirit and scope thereof as encompassed in the accompanying claims. Therefore, it is intended in the accompanying claims to cover all such equivalent variations as come within the scope of the invention as described.

What is claimed is:

1. A polarizing exposure apparatus using a polarizer comprising a light source for radiating light, a focusing lens for focusing said light, a wafer, a reduction projection lens for forming a pattern on said wafer by reducing said light focused through said focusing lens, wherein a pair of polarizing plates for respectively polarizing said light radiated from said light source are established between said light source and said focusing lens and a polarizing mask for passing only light of a desired pattern from the polarized light focused through said focusing lens are established between said focusing lens and said reduction projection lens.

2. A method for fabrication of a polarizing mask comprises a step for:

depositing a chromium layer on a quartz substrate;
    patterning the chromium layer to form a chromium mask;
    forming a first polarizing film;
    etching said first polarizing film by using a photosensitive film;
    forming a second polarizing film to cover said first polarizing film; and
    etching said second polarizing film to be alternatively formed with said first polarizing film.

3. A polarizing exposure apparatus comprising:

a light source for radiating light for exposure;
    first and second polarizing plates for applying different polarizations to said light radiated from said light source;
    a focusing lens for focusing said differently polarized light;
    a wafer;
    a polarizing mask for forming a circuit pattern on said wafer by selectively passing the light passed through said focusing lens, wherein said polarizing mask has a first polarizing region for passing only light passing through said first polarizing plate and a second polarizing region for passing only light passed through said second polarizing plate; and
    a projection lens for reducing the light passed through said polarizing mask and irradiating said reduced light on said wafer.

* * * * *